United States Patent
Kobilka et al.

(10) Patent No.: US 10,899,884 B2
(45) Date of Patent: Jan. 26, 2021

(54) FLAME-RETARDANT POLYETHERETHERKETONE-BASED COMPOUNDS

(71) Applicant: International Business Machines Corporation, Armonk, NY (US)

(72) Inventors: Brandon M. Kobilka, Tucson, AZ (US); Joseph Kuczynski, North Port, FL (US); Jason T. Wertz, Peasant Valley, NY (US); Scott B. King, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 149 days.

(21) Appl. No.: 16/204,206

(22) Filed: Nov. 29, 2018

(65) Prior Publication Data

US 2020/0172668 A1 Jun. 4, 2020

(51) Int. Cl.
*C08G 65/40* (2006.01)
*C08K 5/17* (2006.01)
(Continued)

(52) U.S. Cl.
CPC ............ *C08G 65/4012* (2013.01); *C08K 5/17* (2013.01); *C08K 5/5313* (2013.01);
(Continued)

(58) Field of Classification Search
CPC .................... C08G 65/4012; C08G 2650/40
See application file for complete search history.

(56) References Cited

U.S. PATENT DOCUMENTS 6,627,704 B2   9/2003  Yeager
7,045,203 B2   5/2006  Christou
(Continued)

FOREIGN PATENT DOCUMENTS

CN      106497042 B     3/2017
WO      2001044258 A1   6/2001

OTHER PUBLICATIONS

Han et al. "Considerations of the morphology in the design of proton exchange membranes: Cross-linked sulfonated poly(ether ether ketone)s using a new carboxyl-terminated benzimidazole as the cross-linker for PEMFCs" International Journal of Hydrogen Energy, 36, 2011, 2197-2206 (Year: 2011).*
(Continued)

*Primary Examiner* — Peter F Godenschwager
(74) *Attorney, Agent, or Firm* — Michael D. Purdham (57) ABSTRACT

A flame-retardant compound, a process for forming a flame-retardant compound, and an article of manufacture comprising a material containing a flame-retardant polyetheretherketone based polymer are disclosed. The flame-retardant compound includes two or more polyetheretherketone polymer chains and at least one flame-retardant aryl diamine cross-linker moiety, wherein the flame-retardant aryl diamine cross-linker moiety contains at least one flame-retardant functional group. The process includes selecting a flame-retardant aryl diamine, wherein the flame-retardant aryl diamine contains at least one flame-retardant functional group, selecting a polyetheretherketone polymer, and reacting the flame-retardant aryl diamine with the polyetheretherketone polymer to form a flame-retardant polyetheretherketone based polymer having flame-retardant aryl diamine cross-linkers, wherein the flame-retardant aryl diamine cross-linkers contain the at least one flame-retardant functional group. The article of manufacture includes a material containing a flame-retardant polyetheretherketone (Continued)

based polymer having flame-retardant aryl diamine crosslinkers.

8 Claims, 11 Drawing Sheets

(51) Int. Cl.
    *C08K 5/5313*     (2006.01)
    *H05K 1/05*     (2006.01)
    *C08K 5/5333*     (2006.01)

(52) U.S. Cl.
    CPC ........... *C08K 5/5333* (2013.01); *H05K 1/056* (2013.01); *C08G 2650/40* (2013.01)

(56) References Cited

U.S. PATENT DOCUMENTS

| | | |
|---|---|---|
| 2007/0142569 A1 | 6/2007 | Donovan |
| 2015/0315344 A1 | 11/2015 | Leibler |
| 2018/0201732 A1 | 7/2018 | Groote |

OTHER PUBLICATIONS

Kobilka, et al., "Cyclic Bio-Renewable Flame Retardants", U.S. Appl. No. 16/135,131, filed Sep. 19, 2018.

Patel, Parina, "Investigation of the Fire Behaviour of PEEK-based Polymers and Compounds", Thesis for Degree of Doctor of Philosophy at University of Central Lancashire in collaboration with Victrex plc, Feb. 2011, 225 pages, <https://core.ac.uk/download/pdf/340648.pdf>.

Shukla, et al, "Modification of Poly(ether ether ketone) Polymer for Fuel Cell Application", Hindawi Publishing Corporation, Journal of Applied Chemistry, vol. 2013, Article ID 386903, 8 pages.

Yurchenko, et al., "Synthesis, mechanical properties and chemical/solvent resistance of crosslinked poly(aryl-ethereethereketones) at high temperatures", Polymer 51 (2010), © 2010 Published by Elsevier Ltd., pp. 1914-1920.

Unknown, "Commercial Sources for Tetrabromodiaminobenzene," SciFinder, ©2018 American Chemical Society (ACS), 1 pg.

Unknown, "Diaminohaloarenes," SciFinder, ©2018 American Chemistry Society (ACS), 2 pgs.

* cited by examiner

FLAME-RETARDANT POLYETHERETHERKETONE-BASED COMPOUNDS

BACKGROUND

The present disclosure relates to flame-retardant compounds and, more specifically, to flame-retardant polyetheretherketone-based compounds.

Polyetheretherketone (PEEK) is a polymer with favorable properties in certain applications, including temperature resistance, chemical resistance, and mechanical characteristics. PEEK can be used to fabricate items used in demanding applications, including bearings, piston parts, pumps, electrical cable insulation, vacuum applications, and medical implants.

SUMMARY

Various embodiments are directed to a flame-retardant compound comprising two or more polyetheretherketone polymer chains and at least one flame-retardant aryl diamine cross-linker moiety, wherein the flame-retardant aryl diamine cross-linker moiety contains at least one flame-retardant functional group. The at least one flame-retardant functional group can be a halogen atom or a phosphorous-based moiety. The phosphorous-based moiety can be a phosphine oxide, a phosphonate ester, or a cyclic phosphonate. The at least one phosphorus-based moiety includes at least one R functional group independently selected from a group consisting of alkyl, alkenyl groups, alkynyl groups, cycloalkyl groups, cycloalkenyl groups, alkaryl groups, and aralkyl groups.

Additional embodiments are directed to a process of forming a flame-retardant polymer. The process can include selecting a flame-retardant aryl diamine, wherein the flame-retardant aryl diamine contains at least one flame-retardant functional group, selecting a polyetheretherketone polymer, and reacting the flame-retardant aryl diamine with the polyetheretherketone polymer to form a flame-retardant polyetheretherketone based polymer having flame-retardant aryl diamine cross-linkers, wherein the flame-retardant aryl diamine cross-linkers contain the at least one flame-retardant functional group. The reacting can comprise heating the flame-retardant aryl diamine with the polyetheretherketone polymer in diphenyl sulfone and treating a result of the heating with compression molding. The at least one flame-retardant functional group can be a halogen atom or a phosphorous-based moiety. The phosphorous-based moiety can be a phosphine oxide, a phosphonate ester, or a cyclic phosphonate. The at least one phosphorus-based moiety includes at least one R functional group independently selected from a group consisting of alkyl, alkenyl groups, alkynyl groups, cycloalkyl groups, cycloalkenyl groups, alkaryl groups, and aralkyl groups.

Further embodiments are directed to an article of manufacture comprising a material containing a flame-retardant polyetheretherketone based polymer having flame-retardant aryl diamine cross-linkers. The article of manufacture can comprise an electronic component. The material can be a plastic for integrated circuit packaging. The article of manufacture can be a printed circuit board. The flame-retardant aryl diamine cross-linkers can contain at least one flame-retardant functional group.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate generally to polyetheretherketone (PEEK), and more specifically, to cross-linked PEEK molecules. While the present disclosure is not necessarily limited to such applications, various aspects of the disclosure can be appreciated through a discussion of various examples using this context.

Cross-linked PEEK materials can have additional properties beyond that of PEEK, including being soft and rubbery, and further with useful elastomeric properties for high temperature applications. Possible applications of swell-resistant elastomeric materials can be in areas where low strain and/or low stress high temperature applications with improved creep resistance are required, which can include hostile thermal/chemical environments.

In addition to the above described properties of PEEK and cross-linked PEEK polymers in general, certain cross-linked PEEK polymers exhibit flame-retardant properties. Due to the nature of the nucleophilic aromatic substitution polymerization used to synthesize PEEK, it is all but impossible to have flame-retardant functional groups on PEEK monomers as they will react under the aggressive polymerization conditions. Thus, a need exists to render cross-linked PEEK flame-retardant polymers as a result of a post-polymerization process. This application demonstrates methods of how to accomplish this and examples of products of reactions which involve creating a cross-linker with flame-retardant functional groups and reacting the cross-linker with PEEK to obtain cross-linked PEEK polymers with flame-retardant properties. The resultant cross-linked PEEK polymers include ones with functional groups which are either halogens or phosphorous-based moieties, and thus have flame-retardant properties. The cross-linked PEEK polymers described herein may have varying molecular weights depending on the cross-linker and reaction conditions used (which can affect the degree of cross-linking and size of the resultant polymer) and may range e.g., from 25,000 g/mol to 100,000 g/mol. In other embodiments, it is possible for the molecular weights to range from as low as 5,000 g/mol to as high as 2,000,000 g/mol.

One example of an application of polymers that incorporate flame-retardant cross-linked PEEK polymer compounds is in plastics used in electronics hardware, such as integrated circuit packages. Additional applications can include acoustic dampening, cushioning, plastics, synthetic fibers, insulation, etc. Further, materials containing the flame-retardant cross-linked PEEK polymer compounds can be incorporated into various devices with electronic components that can include printed circuit boards (PCBs), semiconductors, transistors, optoelectronics, capacitors, resistors, chip carriers, etc.

Resins for printed circuit boards (PCBs) can be made flame retardant by incorporating polymers that include flame-retardant cross-linked PEEK polymer compounds. PCBs are electrical circuits that can be found in many types of electronic devices, and they support and electronically connect electrical components in the device. PCBs are formed by etching a copper conductive layer laminated onto an insulating substrate. The insulating substrate can be a laminate comprising a resin and a fiber. Many resins in PCBs contain a polymer, such as an epoxy, a polyhydroxyurethane, a polycarbonate, a polyester, a polyacrylate, a poly-imide, a polyamide, a polyurea, a poly(vinyl-ester), etc. Using polymers that incorporate the flame-retardant cross-linked PEEK polymer compounds can prevent the PCB from catching fire when exposed to high temperature environments or electrical power overloads.

Furthermore, PEEK is a is a high performance semicrystalline thermoplastic with wide applications in aerospace, automotive, coating, electrical insulating material, and oil fields. Highly crystalline PEEK materials display excellent mechanical, thermal and chemical resistance properties. Adding flame retardant properties to those properties can further provide for resistive properties making flame-retardant cross-linked PEEK polymer compounds even more durable for these applications.

Figure 1:
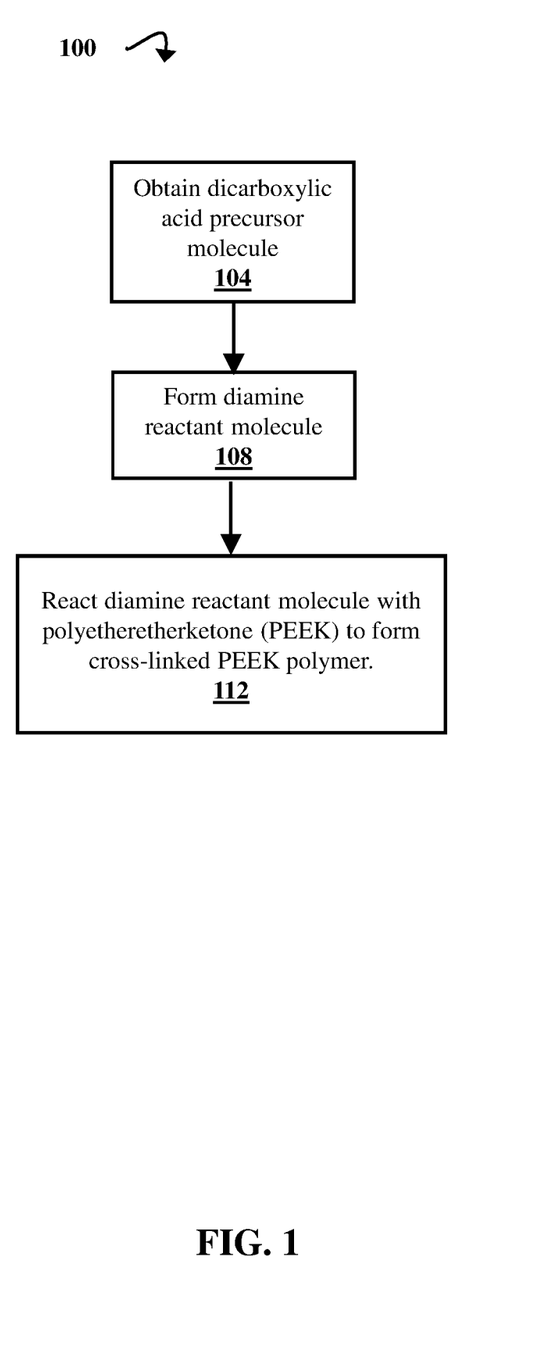
FIG. 1 is a flow diagram illustrating a process of forming a cross-linked polyetheretherketone (PEEK) polymer, according to some embodiments of the present disclosure.
Figure 2A:
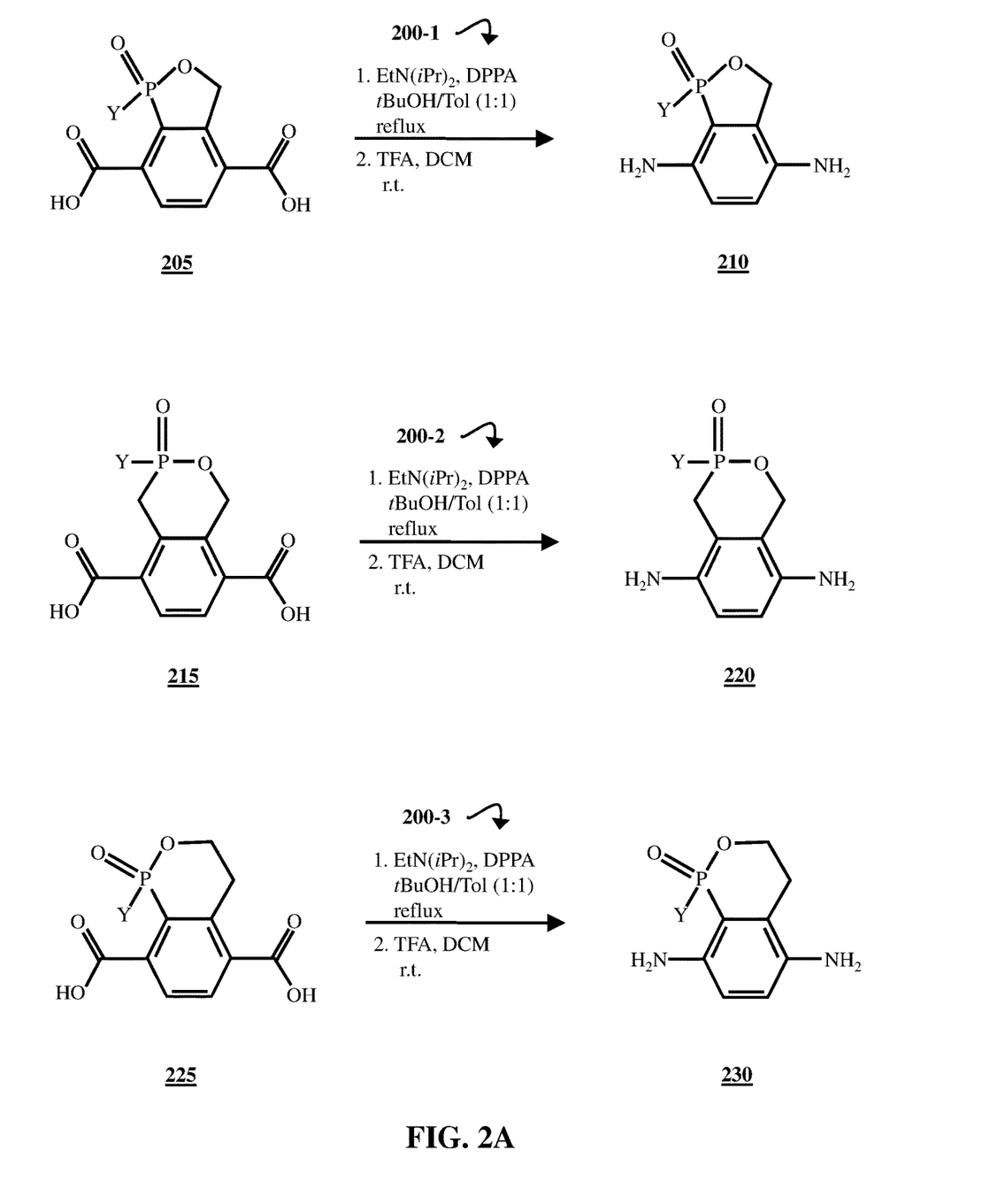
FIG. 2A is a chemical reaction diagram illustrating three processes of synthesizing aryl diamine reactant molecules, according to some embodiments of the present disclosure.
Figure 2B:
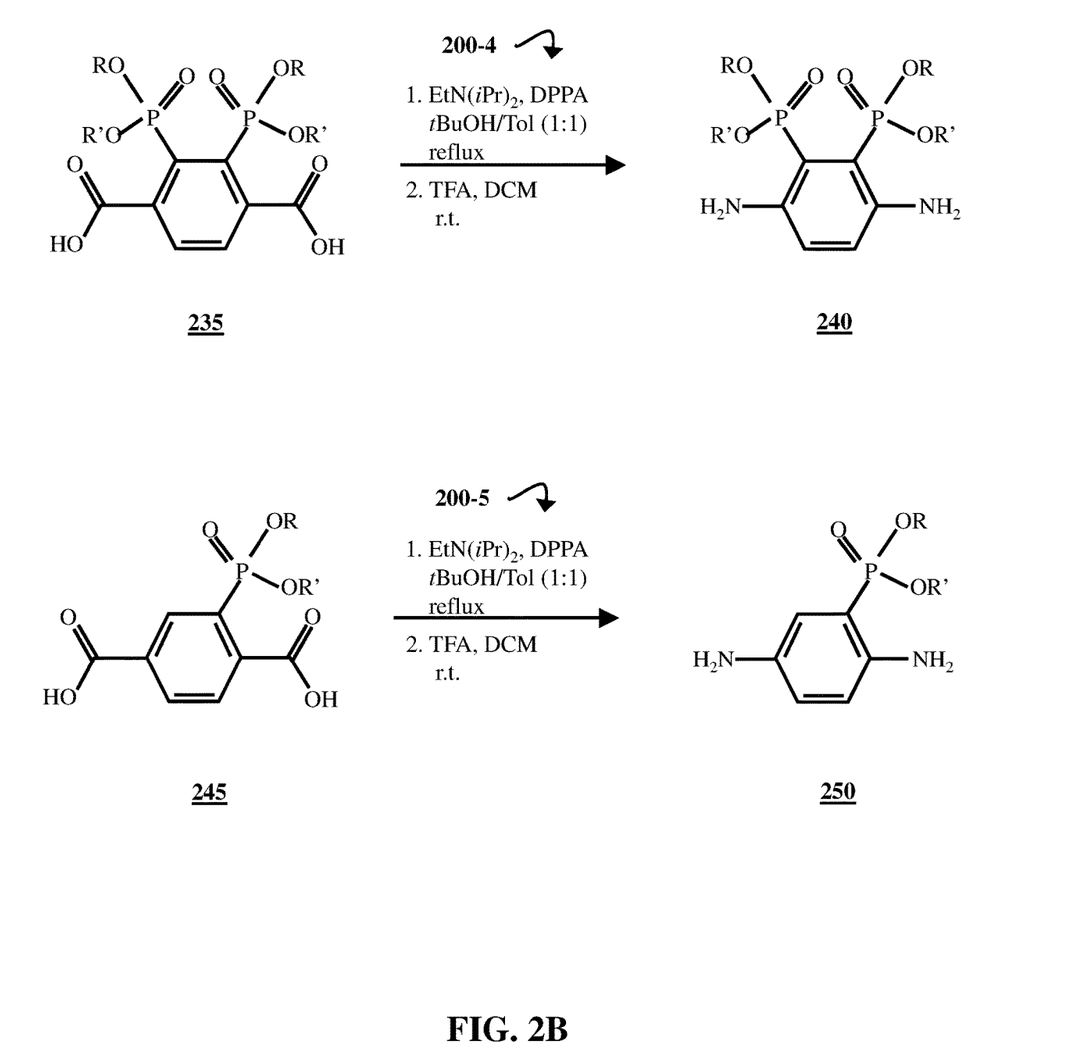
FIG. 2B is a chemical reaction diagram illustrating two processes of synthesizing aryl diamine reactant molecules, according to some embodiments of the present disclosure.

FIG. 1 is a flow diagram illustrating a process 100 of forming a cross-linked polyetheretherketone (PEEK) polymer, according to some embodiments of the present disclosure. Process 100 begins with obtaining a dicarboxylic acid precursor molecule. This is illustrated at 104. Examples of dicarboxylic acid precursor molecules are shown in FIGS. 2A and 2B as 205, 215, 225, 235, and 245. The dicarboxylic acid precursor molecules contain flame-retardant phosphorous-based moieties as shown in FIG. 2.

The phosphorus-based moieties present in the dicarboxylic acid precursor molecule add flame-retardancy to the resulting aryl diamine reactant molecule of operation 108 and ultimately to the cross-linked PEEK polymer with flame-retardant properties. Some phosphorus-based moieties include at least one R functional group (R and/or R'). Some phosphorous-based moieties include a Y functional group bonded to it at the phosphorus atom. The Y functional group is chosen from a group consisting of R, OR, and Cl groups.

The R functional groups are independently selected from reactive functional groups and non-reactive functional groups. Herein, "reactive" refers to the functional group's tendency to participate in reactions that include polymerization and binding to polymer chains. Non-reactive R functional groups are those that do not have reactive moieties for participating in the binding or polymerization reactions. However, depending on the structure of the non-reactive groups, they can contribute to the overall properties of the flame-retardant compounds, such as steric hindrance and polarity. Non-reactive R groups can be hydrocarbyl groups without heteroatoms, though they can include heteroatoms in some embodiments. Non-reactive hydrocarbyl groups that can be used include alkyl, alkenyl, alkynyl, cycloalkyl, cycloalkenyl, alkaryl, and aralkyl groups.

Examples of reactive R groups have reactive moieties such as allyl, epoxy, amine, carboxylate, propylene carbonate, and hydroxyl. The reactive R groups can have other moieties as well, such as hydrocarbyl moieties with or without heteroatoms (e.g., nitrogen, oxygen, halogens, sulfur, etc.). Examples of hydrocarbyl groups include cyclic and/or acyclic aliphatic moieties optionally containing one or more double and/or triple bonds. The acyclic aliphatic groups can be branched or unbranched. Examples of hydrocarbyl groups include alkyl, alkenyl, alkynyl, cycloalkyl, cycloalkenyl, alkaryl, and aralkyl groups.

At 108, an aryl diamine reactant molecule to be reacted with PEEK is formed from the dicarboxylic acid precursor molecule obtained at 104. Examples of operation 108 are shown as reactions 200-1 through 200-5 in FIGS. 2A and 2B and generally involve replacing the carboxylic acid functional groups with amine functional groups, as discussed in further detail below. In some embodiments, operation 104 is not necessary, such as where the aryl diamine reactant molecule to be formed in operation 108 is commercially available or where a different known synthetic pathway to the aryl diamine reactant molecule is known to those skilled in the art.

At 112, the aryl diamine reactant molecule formed at 108 is reacted with PEEK to form a cross-linked PEEK polymer with flame-retardant properties. Operation 112 can proceed as shown in the examples of FIGS. 3A through 3E and 4A through 4C, as discussed in further detail below. Operation 112 generally involves heating the reaction mixture to approximately 250-260° C., followed by compression molding.

FIG. 2A is a chemical reaction diagram illustrating three processes 200-1, 200-2, and 200-3 of synthesizing aryl diamine reactant molecules, according to some embodiments of the present disclosure. In process 200-1, the first step begins by preparation of a solution of dicarboxylic acid precursor molecule 205 in approximately 1:1 toluene to t-butyl alcohol (tBuOH) at room temperature under nitrogen gas ($N_2$). To that solution, N,N-diisopropylethylamine (i-$Pr_2$NEt) is added, followed by addition of diphenylphosphoryl azide (DPPA or $(PhO)_2P(O)N_3$), each in an amount approximately 2.5 moles per mole of dicarboxylic acid precursor molecule 205. The resulting solution is stirred at reflux for approximately 5 hours. After reflux, the solution can be allowed to cool before purification. Purification can proceed e.g., by partitioning the solution between ethyl acetate (EtOAc) and water. The layers can be separated and the organic extract can be washed with water and brine. This can be followed by drying over $Na_2SO_4$ and concentration. Further purification is possible by flash chromatography on silica gel, which can proceed by elution with 1:1 EtOAc:hexanes followed by 2:1 EtOAc:hexanes. This reaction results in a carbamate (not shown) of the dicarboxylic acid precursor molecule 205.

The second step of process 200-1 begins by taking the product of the first step (the carbamate) and creating a solution of it in DCM at room temperature under $N_2$. To this solution, trifluoroacetic acid (TFA) is added. This solution can be stirred at room temperature for approximately 3 hours. The resulting solution can be concentrated under a stream of $N_2$ gas. The residue can be purified, such as by flash chromatography on silica gel, which can proceed by elution with 3:1 EtOAc:hexanes followed by 15:1 chloroform ($CHCl_3$):methanol (MeOH). The result of the second step of process 200-1 is the aryl diamine reactant molecule 210 as shown, where the carboxylic acid groups of the starting material have been replaced with amines.

In some embodiments, alterations to the reaction conditions of process 200-1 can be employed as will be apparent to those of skill in the art. For example, instead of using DCM, other halogenated solvents such as chloroform, dichloroethane, tetrahydrofuran, 1,4-dioxane, and/or diethyl ether could be used. As an additional example, instead of using toluene, other similar solvents such as benzene, xylene, or similar alternatives could be used. Additional alterations, such as to purification techniques are possible.

Variations of process 200-1 can be performed for each dicarboxylic acid precursor 205 with the various possible Y functional groups (described above) present to form corresponding variations of resultant aryl diamine reactant molecules 210.

Processes 200-2 and 200-3 of FIG. 2A differ only in the dicarboxylic acid precursor molecule used (215 and 225, respectively) and the resultant aryl diamine reactant molecules (220 and 230, respectively). As with process 200-1, alterations of the reaction conditions can be employed as appropriate. Additionally, variations of processes 200-2 and 200-3 can be performed for each dicarboxylic acid precursor 215 and 225 with the various possible Y functional groups (described above) present to form corresponding variations of resultant aryl diamine reactant molecules 220 and 230. In each of processes 200-1 through 200-3, the dicarboxylic acid precursors 205, 215, and 225 and the resultant aryl diamine reactant molecules 210, 220, and 230 feature cyclic phosphonates as flame retardant functional groups.

FIG. 2B is a chemical reaction diagram illustrating two processes 200-4 and 200-5 of synthesizing aryl diamine reactant molecules, according to some embodiments of the present disclosure. Processes 200-4 and 200-5 of FIG. 2B differ principally from the processes of FIG. 2A only in the dicarboxylic acid precursor molecule used (235 and 245, respectively) and the resultant aryl diamine reactant molecules (240 and 250, respectively). The reaction conditions, or alterations of the reaction conditions as appropriate can be employed as shown in the figure and as described above regarding process 200-1. Additionally, variations of processes 200-4 and 200-5 can be performed for each dicarboxylic acid precursor 235 and 245 with the various possible R functional groups (described above) present to form corresponding variations of resultant aryl diamine reactant molecules 240 and 250. In each of processes 200-4 and 200-5, the dicarboxylic acid precursors 235 and 245 and the resultant aryl diamine reactant molecules 240 and 250 feature phosphonate esters as flame retardant functional groups.

In processes 200-1 through 200-5 of FIGS. 2A and 2B, the starting materials 205, 215, 225, 235, and 245 have been depicted as dicarboxylic acid precursor molecules. In some embodiments, alternative starting materials of t-butyl esters (or other esters) of the dicarboxylic acid precursor molecules can be used. These can be obtained through other syntheses not described herein or can be obtained from the dicarboxylic acid precursors through conventional esterification reactions. In embodiments using t-butyl esters (or other esters) of the dicarboxylic acid precursor molecules, such starting materials can first be reacted in a solution of dichloromethane (DCM) at 0° C. with trifluoroacetic acid (TFA) under nitrogen gas ($N_2$). The solution can be stirred at 0° C. for approximately 1 hour, followed by stirring at room temperature for approximately 3 hours. The reaction mixture can then be concentrated under a stream of $N_2$ followed by high vacuum to obtain the dicarboxylic acid precursor molecules 205, 215, 225, 235, and 245 for further use in processes 200-1 through 200-5.

Figure 3A:
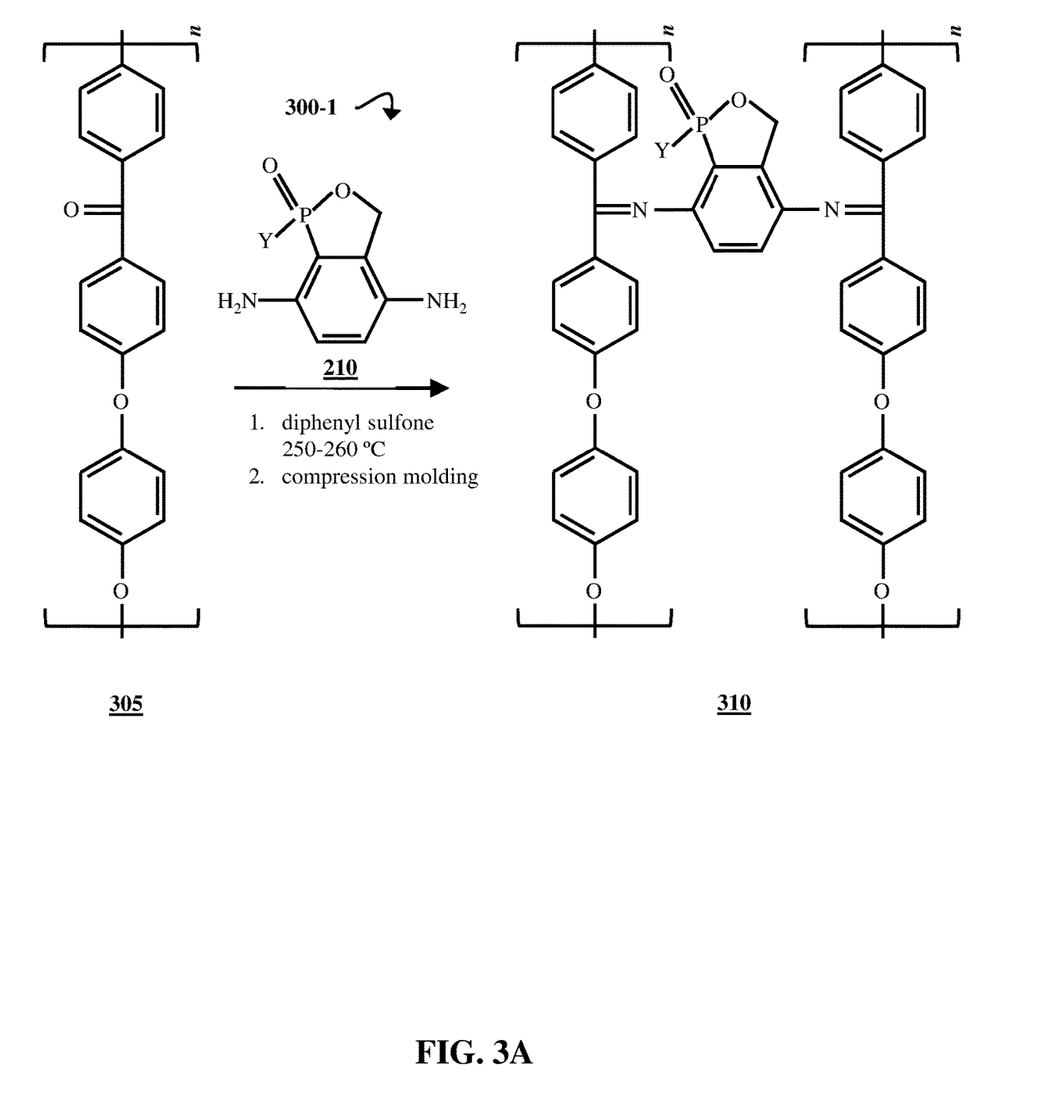
FIG. 3A is a chemical reaction diagram illustrating a process of reacting an aryl diamine reactant molecule with polyetheretherketone (PEEK) to form a cross-linked PEEK polymer, according to some embodiments of the present disclosure.
Figure 3B:
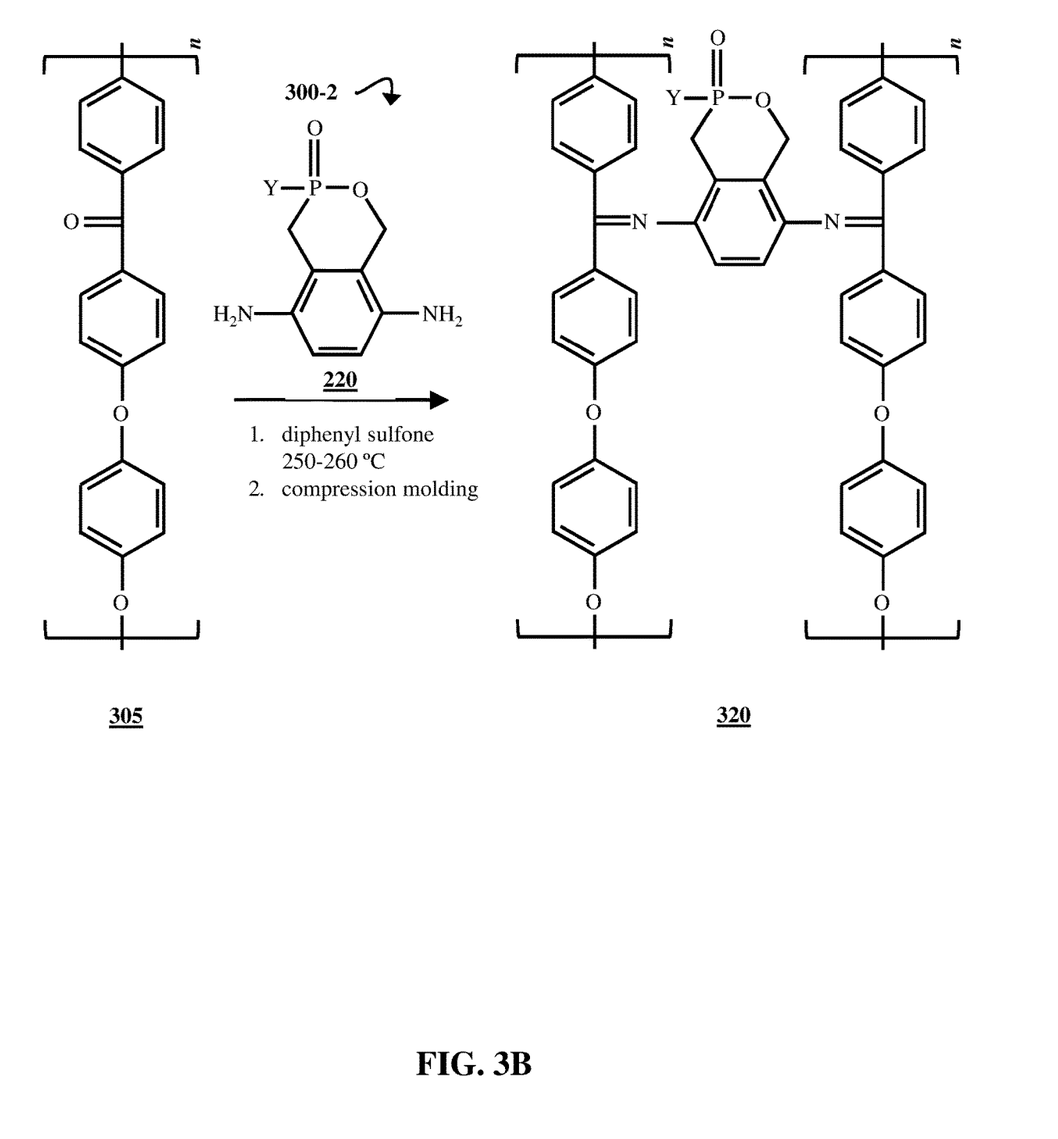
FIG. 3B is a chemical reaction diagram illustrating a process of reacting an aryl diamine reactant molecule with polyetheretherketone (PEEK) to form a cross-linked PEEK polymer, according to some embodiments of the present disclosure.
Figure 3C:
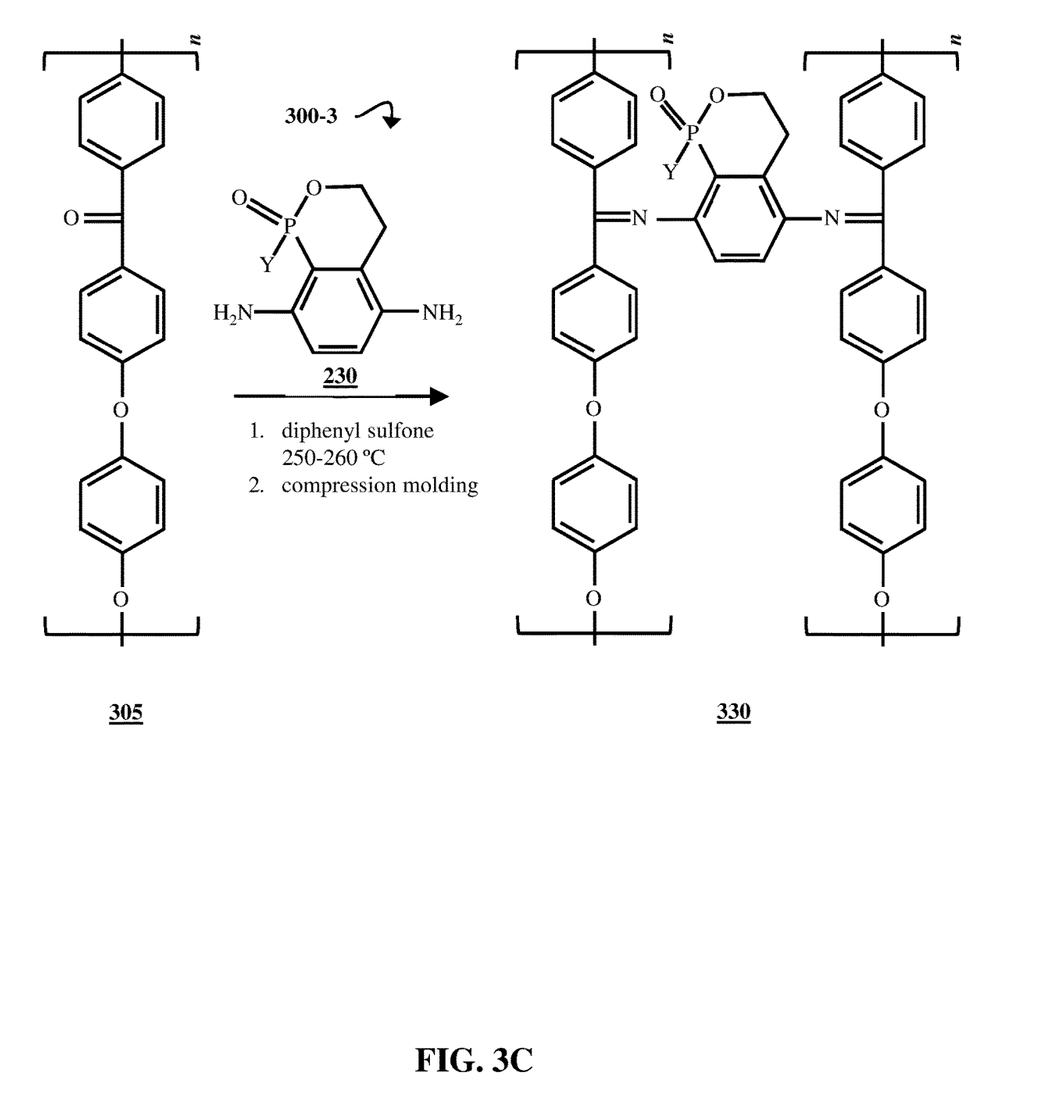
FIG. 3C is a chemical reaction diagram illustrating a process of reacting an aryl diamine reactant molecule with polyetheretherketone (PEEK) to form a cross-linked PEEK polymer, according to some embodiments of the present disclosure.
Figure 3D:
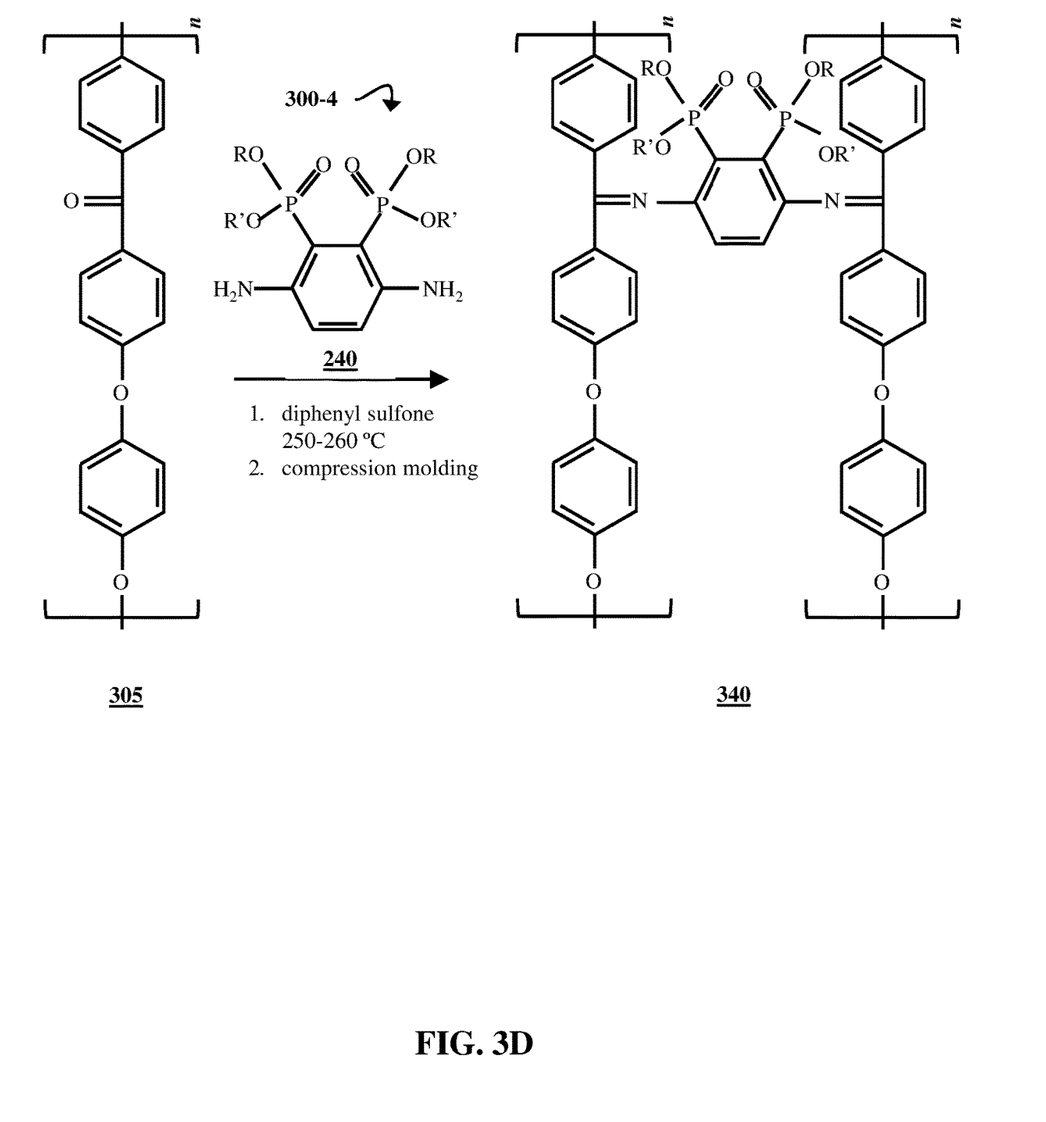
FIG. 3D is a chemical reaction diagram illustrating a process of reacting an aryl diamine reactant molecule with polyetheretherketone (PEEK) to form a cross-linked PEEK polymer, according to some embodiments of the present disclosure.
Figure 3E:
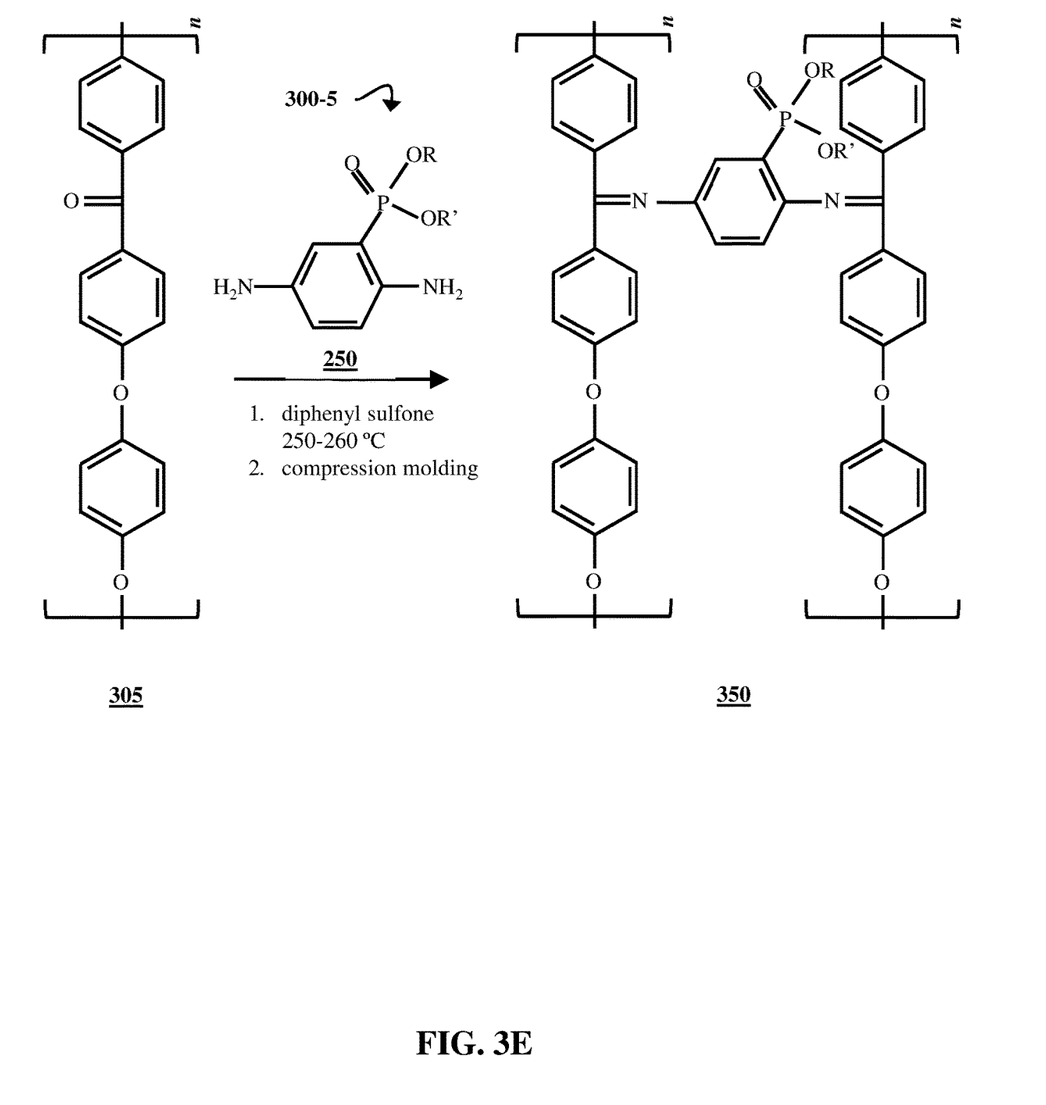
FIG. 3E is a chemical reaction diagram illustrating a process of reacting an aryl diamine reactant molecule with polyetheretherketone (PEEK) to form a cross-linked PEEK polymer, according to some embodiments of the present disclosure.

FIG. 3A is a chemical reaction diagram illustrating a process 300-1 of reacting an aryl diamine reactant molecule with polyetheretherketone (PEEK) to form a cross-linked PEEK polymer, according to some embodiments of the present disclosure. In process 300-1, the first step begins with combining PEEK (305), aryl diamine reactant molecule 210, and diphenyl sulfone, which are then placed under continuous nitrogen purge. The mixture can be quickly heated to approximately 300-320° C. with vigorous stirring. Because various aryl diamine reactant molecules 210 can have boiling points at approximately 260° C., when the temperature reaches approximately 260° C., the nitrogen purge is discontinued to avoid loss of the aryl diamine reactant molecule 210. Once PEEK (305) is dissolved in the diphenyl sulfone, the reaction mixture is cooled to approximately 250-260° C. and maintained at this temperature for approximately 3 hours with stirring. Approximately hourly, the reaction mixture can be purged with nitrogen for a short period of time (e.g., 10 minutes) to remove the water by-product. After approximately 3 hours, the hot mixture can be poured into a container such as a glass dish, where it will form a solid.

Purification can proceed e.g., by breaking the solid into small pieces, grinding the solid, and stirring the solid with acetone overnight. This mixture can be sonicated for approximately 1 hour to dissolve unreacted aryl diamine reactant molecule 210 and diphenyl sulfone. The suspension in acetone can be filtered on a vacuum filter. This purification procedure can be repeated as necessary (which in some embodiments can be three times), which can be to the point where the supernatant acetone solution exhibits no color and infrared spectroscopy reveals the absence of diphenyl sulfone in the product. After purification, the product can be dried on a vacuum filter and then heated in a vacuum oven overnight.

The result of the first step of process 300-1 is the PEEK polymer where the aryl diamine reactant molecule 210 has replaced the ketone functional group to form an imine. The extent of ketone replacement in the PEEK polymer will depend on the relative quantities of PEEK and aryl diamine reactant molecule 210 used. The second step of process 300-1 proceeds by placing the result of the first step in a compression mold. This can proceed by using an instrument such as a Carver 4120 hydraulic press at 343° C. with post-curing at 250° C. for approximately 4 hours. Alternative presses can be used in some embodiments. Through the second step of process 300-1, cross-linked PEEK polymer 310 is formed.

In some embodiments, alterations to the reaction conditions of process 300-1 can be employed as will be apparent to those of skill in the art. For example, for each aryl diamine reactant molecule 210, the boiling point of that molecule can be determined. Based upon the boiling point, the temperatures used can be increased or decreased correspondingly. Additional alterations, such as to purification techniques are possible.

Variations of process 300-1 can be performed for each aryl diamine reactant molecule 210 with the various possible Y functional groups (described above) present to form corresponding variations of resultant cross-linked PEEK polymer 310.

FIGS. 3B, 3C, 3D, and 3E are chemical reaction diagrams illustrating processes 300-2, 300-3, 300-4, and 300-5 of reacting aryl diamine reactant molecules 220, 230, 240, and 250, respectively with polyetheretherketone (PEEK) to form a cross-linked PEEK polymer (320, 330, 340, and 350, respectively), according to some embodiments of the present disclosure.

Processes 300-2, 300-3, 300-4, and 300-5 of FIGS. 3B, 3C, 3D, and 3E differ only in the aryl diamine reactant molecules 220, 230, 240, and 250 used and the resultant cross-linked PEEK polymer (320, 330, 340, and 350, respectively). As with process 300-1, alterations of the reaction conditions can be employed as appropriate. Additionally, variations of processes 300-2, 300-3, 300-4, and 300-5 can be performed for each aryl diamine reactant molecules 220, 230, 240, and 250 with the various possible Y functional groups (described above) or R functional groups present to form corresponding variations of resultant cross-linked PEEK polymers 320, 330, 340, and 350.

Figure 4A:
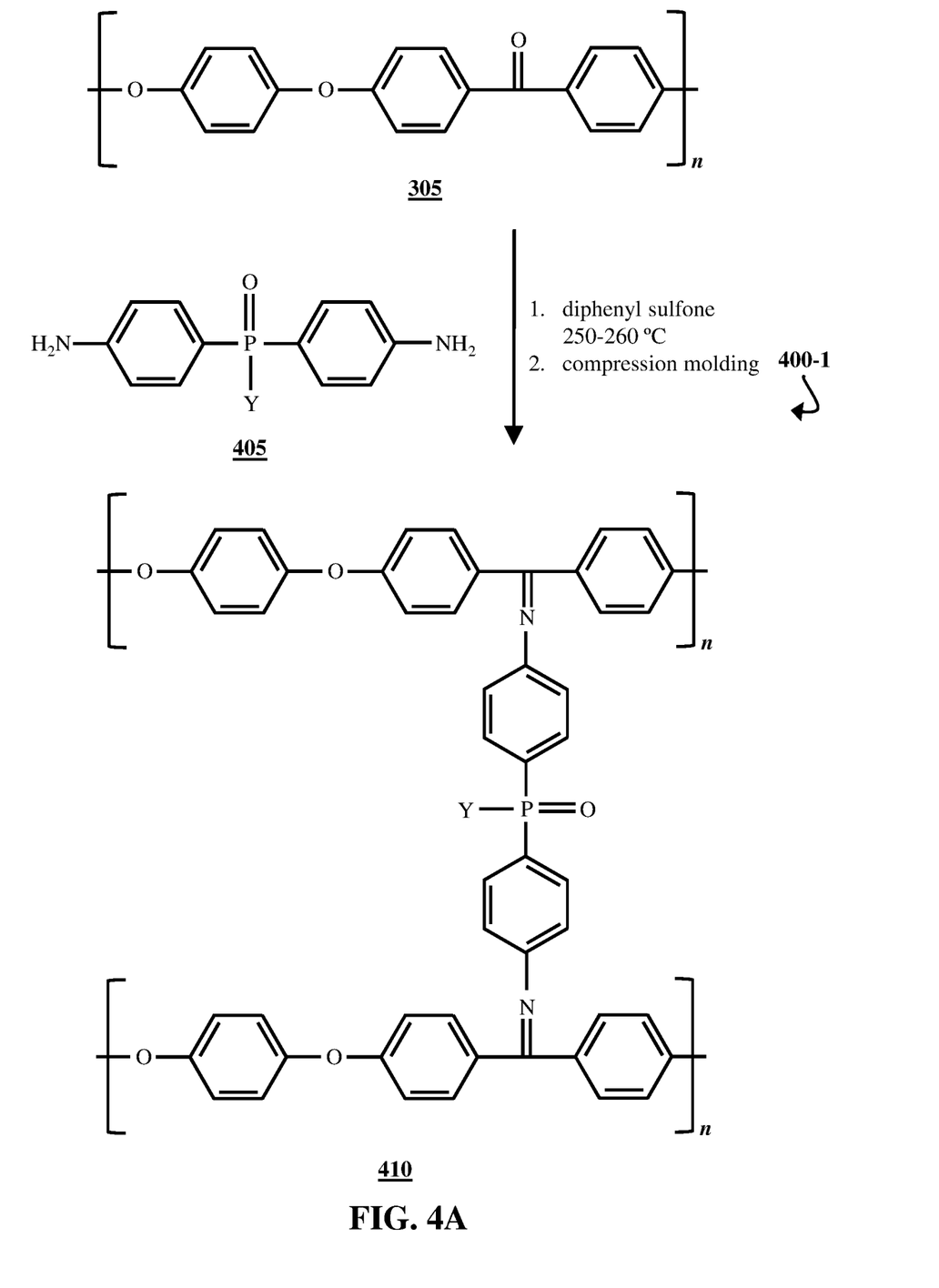
FIG. 4A is a chemical reaction diagram illustrating a process of reacting an aryl diamine reactant molecule with polyetheretherketone (PEEK) to form a cross-linked PEEK polymer, according to some embodiments of the present disclosure.

FIG. 4A is a chemical reaction diagram illustrating a process 400-1 of reacting an aryl diamine reactant molecule 405 with polyetheretherketone (PEEK) 305 to form a cross-linked PEEK polymer 410, according to some embodiments of the present disclosure. In process 400-1, in contrast to the various aryl diamine reactant molecules discussed above regarding FIGS. 2A, 2B, 3A, 3B, 3C, 3D, and 3E, the aryl diamine reactant molecule 405 is an organophosphine oxide with the amine groups present on separate aromatic rings. As above, various Y functional groups can be bonded to the phosphorus atom of aryl diamine reactant molecule 405.

Process 400-1 can proceed similarly to processes 300-1 through 300-5, but using aryl diamine reactant molecule 405 and PEEK 305 as the starting materials. This can proceed through the heating in diphenyl sulfone step, followed by compression molding, as discussed more completely above. Process 400-1 results in a cross-linked PEEK polymer 410 as shown in the figure.

Figure 4B:
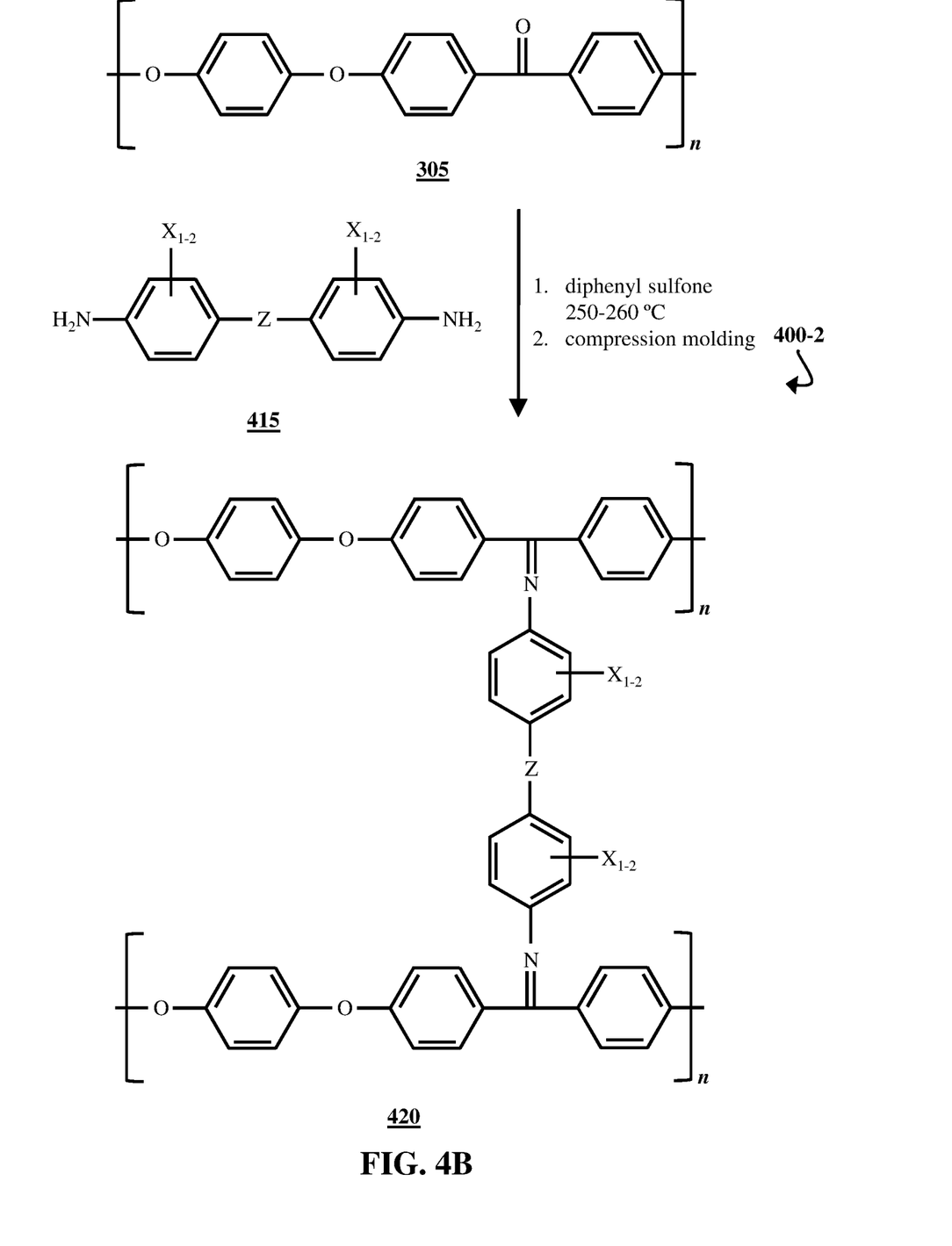
FIG. 4B is a chemical reaction diagram illustrating a process of reacting an aryl diamine reactant molecule with polyetheretherketone (PEEK) to form a cross-linked PEEK polymer, according to some embodiments of the present disclosure.

FIG. 4B is a chemical reaction diagram illustrating a process 400-2 of reacting an aryl diamine reactant molecule 415 with polyetheretherketone (PEEK) 305 to form a cross-linked PEEK polymer 420, according to some embodiments of the present disclosure. In process 400-2, in contrast to the various aryl diamine reactant molecules discussed above regarding FIGS. 2A, 2B, 3A, 3B, 3C, 3D, and 3E, the aryl diamine reactant molecule 415 has two aromatic rings linked by a Z functional group with the amine groups present on separate aromatic rings. As used herein, a Z functional group can be an oxygen atom, a sulfur atom, a $CH_2$ group, a $C(CH_3)_2$ group, a (C=O)O group, or a C=O group. Additionally the aryl diamine reactant molecule 415 contains one to two X groups on each aromatic ring, where each X is a halogen atom of either chlorine or bromine.

Process 400-2 can proceed similarly to processes 300-1 through 300-5, but using aryl diamine reactant molecule 415 and PEEK 305 as the starting materials. This can proceed through the heating in diphenyl sulfone step, followed by compression molding, as discussed more completely above. Process 400-1 results in a cross-linked PEEK polymer 420 as shown in the figure.

Figure 4C:
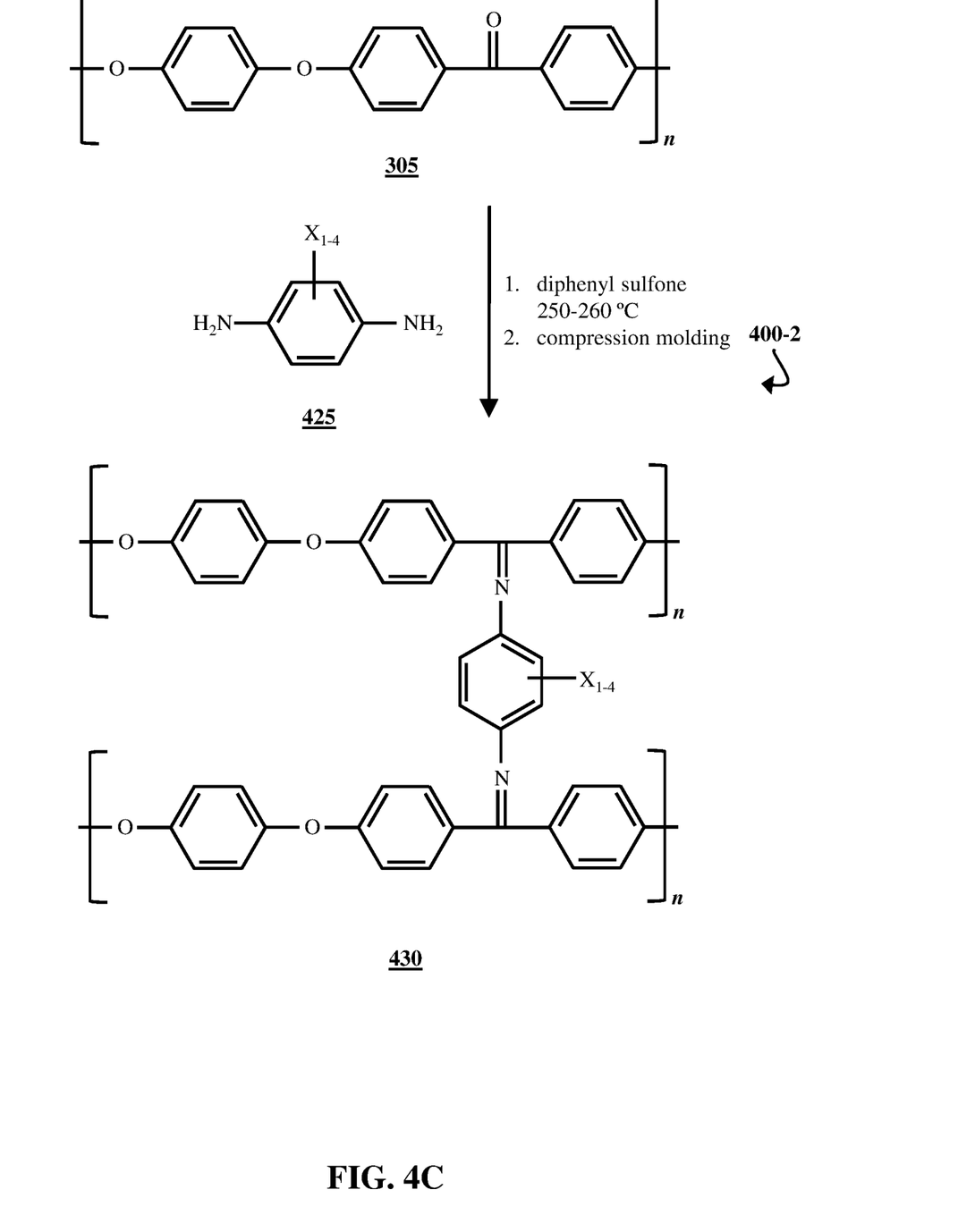
FIG. 4C is a chemical reaction diagram illustrating a process of reacting an aryl diamine reactant molecule with polyetheretherketone (PEEK) to form a cross-linked PEEK polymer, according to some embodiments of the present disclosure.

FIG. 4C is a chemical reaction diagram illustrating a process 400-3 of reacting an aryl diamine reactant molecule 425 with polyetheretherketone (PEEK) 305 to form a cross-linked PEEK polymer 430, according to some embodiments of the present disclosure. In process 400-3, in contrast to the various aryl diamine reactant molecules discussed above regarding FIGS. 2A, 2B, 3A, 3B, 3C, 3D, and 3E, the aryl diamine reactant molecule 425 contains only one ring, the aromatic ring to which both amine groups are affixed. The aryl diamine reactant molecule 425 contains one to four X groups, where each X is a halogen atom of either chlorine or bromine. An example of aryl diamine reactant molecule 425 is the commercially available compound 2,3,5,6-tetrabromo-1,4-diaminobenzene (which is aryl diamine reactant molecule 425 with 4 X groups, each being bromine). In some embodiments, the amine groups of aryl diamine reactant molecule 425 are not located at the 1 and 4 positions, but rather at 1 and 3 positions.

Process 400-3 can proceed similarly to processes 300-1 through 300-5, but using aryl diamine reactant molecule 425 and PEEK 305 as the starting materials. This can proceed through the heating in diphenyl sulfone step, followed by compression molding, as discussed more completely above. Process 400-3 results in a cross-linked PEEK polymer 430 as shown in the figure.

It should be noted that, in some embodiments, the compounds described herein can contain one or more chiral centers. These can include racemic mixtures, diastereomers, enantiomers, and mixtures containing one or more stereoisomer. Further, the disclosed compounds can encompass racemic forms of the compounds in addition to individual stereoisomers, as well as mixtures containing any of these.

The synthetic processes discussed herein and their accompanying drawings are not to be construed as limiting. One skilled in the art would recognize that a variety of synthetic reactions may be used that vary in reaction conditions, components, methods, etc., which ultimately generate diamine reactant molecules and/or cross-linked PEEK polymers. In addition, the reaction conditions can optionally be changed over the course of a process. Further, in some embodiments, processes can be added or omitted while still remaining within the scope of the disclosure, as will be understood by a person of ordinary skill in the art.

What is claimed is:

1. A method of forming a flame-retardant polymer, comprising:
    selecting a flame-retardant aryl diamine, wherein the flame-retardant aryl diamine contains at least one flame-retardant functional group;
    selecting a polyetheretherketone polymer; and
    reacting the flame-retardant aryl diamine with the polyetheretherketone polymer to form a flame-retardant polyetheretherketone based polymer having flame-retardant aryl diamine cross-linkers, wherein the flame-retardant aryl diamine cross-linkers contain the at least one flame-retardant functional group.

2. The method of claim 1, wherein the reacting the flame-retardant aryl diamine with the polyetheretherketone polymer further comprises:
    heating the flame-retardant aryl diamine with the polyetheretherketone polymer in diphenyl sulfone; and
    treating a result of the heating with compression molding.

3. The method of claim 1, wherein the at least one flame-retardant functional group is a halogen atom.

4. The method of claim 1, wherein the at least one flame-retardant functional group is a phosphor us-based moiety.

5. The method of claim 4, wherein the phosphor us-based moiety is a phosphine oxide.

6. The method of claim 4, wherein the phosphor us-based moiety is a phosphonate ester.

7. The method of claim 4, wherein the phosphor us-based moiety is a cyclic phosphonate.

8. The method of claim 4, wherein the at least one phosphorus-based moiety includes at least one R functional group independently selected from a group consisting of alkyl, alkenyl groups, alkynyl groups, cycloalkyl groups, cycloalkenyl groups, alkaryl groups, and aralkyl groups.

* * * * *